(12) United States Patent
Dedigama et al.

(10) Patent No.: US 11,825,746 B2
(45) Date of Patent: Nov. 21, 2023

(54) THERMOELECTRIC DEVICE

(71) Applicant: MicroPower Global Limited, Tortola (VG)

(72) Inventors: Aruna R. Dedigama, San Marcos, TX (US); Adam G. Westerman, San Marcos, TX (US); Thomas E. Zirkle, Scottsdale, AZ (US)

(73) Assignee: MICROPOWER GLOBAL LIMITED, Tortola (VG)

( * ) Notice: Subject to any disclaimer, the term of this patent is extended or adjusted under 35 U.S.C. 154(b) by 0 days.

(21) Appl. No.: 17/448,605

(22) Filed: Sep. 23, 2021

(65) Prior Publication Data

US 2022/0093840 A1    Mar. 24, 2022

Related U.S. Application Data

(60) Provisional application No. 63/082,242, filed on Sep. 23, 2020.

(51) Int. Cl.
| | | |
|---|---|---|
| *H10N 10/17* | (2023.01) | |
| *H10N 10/01* | (2023.01) | |
| *H10N 10/817* | (2023.01) | |
| *H10N 10/852* | (2023.01) | |

(52) U.S. Cl.
CPC ............ *H10N 10/17* (2023.02); *H10N 10/01* (2023.02); *H10N 10/817* (2023.02); *H10N 10/852* (2023.02)

(58) Field of Classification Search
CPC ......... H01L 35/08; H01L 35/16; H01L 35/32; H01L 35/34; H10N 10/17; H10N 10/852; H10N 10/01; H10N 10/817
See application file for complete search history.

(56) References Cited

U.S. PATENT DOCUMENTS

| | | | |
|---|---|---|---|
| 2003/0133826 A1* | 7/2003 | Lin | B23K 35/262 |
| | | | 420/557 |
| 2007/0138710 A1* | 6/2007 | Fukuyama | C04B 41/52 |
| | | | 428/698 |
| 2009/0000652 A1 | 1/2009 | Von Windheim | |
| 2018/0240957 A1 | 8/2018 | Boukai | |

(Continued)

FOREIGN PATENT DOCUMENTS

| | | |
|---|---|---|
| KR | 1020100116748 A1 | 11/2010 |
| KR | 1020170064336 A1 | 6/2017 |
| KR | 1020180029746 A1 | 3/2018 |

OTHER PUBLICATIONS

International Search Report with regard to International Application No. PCT/US2021/071565, dated Dec. 29, 2021.

(Continued)

*Primary Examiner* — Devina Pillay
(74) *Attorney, Agent, or Firm* — Abel Schillinger, LLP

(57) ABSTRACT

A thermoelectric device can comprise at least one first thermoelectric element, at least one second thermoelectric element, and a bridging structure. The bridging structure can include a bridging layer comprising a silver-gallium alloy. The silver-gallium alloy containing a bridging layer can provide flexibility and stress release to the thermoelectric device when subjected to multiple heating cycles, and may have a very low electrical resistance and thermal resistance.

19 Claims, 5 Drawing Sheets

(56) References Cited

U.S. PATENT DOCUMENTS

2021/0265552 A1* 8/2021 Arai .................. H01L 35/32

OTHER PUBLICATIONS

M.R. Baren,: "The Ag—Ga (Silver-Gallium) System", Temple University, Bulletin of Alloy Phase Diagrams vol. 11, No. 4, 1990, 6 pgs.
Ntasi et al.; "Metallurgical characterization of experimental Ag-based soldering alloys", 1013-9052 © 2014 King Saud University.
Thermo Fisher Scientific, "Gallium Tin alloy, Safety Data Sheet", Feb. 25, 2020, 7 pgs.
Suarez, et al.; "Flexible thermoelectric generator using bulk legs and liquid metal interconnects for wearable electronics", Applied Energy 202 (2017)736-745, 10 pgs.
H. Kolb, et al.; "Evaluation of Detachable Ga-Based Solder Contacts for Thermoelectric Materials", Journal of Electronic Materials, vol. 45, No. 8, 2017, 6 pgs.

* cited by examiner

THERMOELECTRIC DEVICE

CROSS-REFERENCE TO RELATED APPLICATION(S)

This application claims priority under 35 U.S.C. § 119(e) to U.S. Provisional Application No. 63/082,242, entitled "THERMOELECTRIC DEVICE," by Aruna R. DEDIGAMA et al., filed Sep. 23, 2020, which application is assigned to the current assignee hereof and incorporated herein by reference in its entirety.

FIELD OF THE DISCLOSURE

The present disclosure relates to a thermoelectric device, specifically to a thermoelectric device comprising at least one first thermoelectric element, at least one second thermoelectric element, and a bridging structure, wherein the bridging structure comprises a layer including a silver-gallium alloy.

BACKGROUND

Thermoelectric devices are known for converting heat energy to electrical energy. Typically, a temperature gradient is formed between two opposite sides of a thermoelectric device, and the heat flow from the hot side to the cold side creates a voltage that can be utilized for operating an electrical device or being stored. In order to make efficient thermoelectric devices, an important aspect is stable, and, to a certain degree flexible, electrical contacts which electrically connect the thermoelectric elements to one another or to an electrical circuit. Flexibility of the electrical contacts is desired since a thermoelectric device is subjected to multiple cycles of large temperature changes which cause repeated tension and stress within the device because of differences in the thermal expansion of different materials.

There exists a need to improve the strength and flexibility of the electrical contacts of thermoelectric devices to increase the efficiency, stability, and lifetime of these devices.

BRIEF DESCRIPTION OF THE DRAWINGS

The present disclosure may be better understood, and its numerous features and advantages made apparent to those skilled in the art by referencing the accompanying drawings.

DETAILED DESCRIPTION

As used herein, the terms "comprises," "comprising," "includes," "including," "has," "having" or any other variation thereof, are intended to cover a non-exclusive inclusion. For example, a process, method, article, or apparatus that comprises a list of features is not necessarily limited only to those features but may include other features not expressly listed or inherent to such process, method, article, or apparatus.

As used herein, and unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" are employed to describe elements and components described herein. This is done merely for convenience and to give a general sense of the scope of the invention. This description should be read to include one or at least one and the singular also includes the plural unless it is obvious that it is meant otherwise.

Various embodiments of the present disclosure will now be described, by way of example only, with reference to the accompanying drawings.

In one embodiment, the present disclosure is directed to a thermoelectric device comprising at least one first thermoelectric element, at least one second thermoelectric element, and a bridging structure. The bridging structure can include at least one first bridging layer and at least one second bridging layer, wherein the bridging layers may provide a flexible connection between the thermoelectric elements and the bridging structure to compensate stresses that can form within the thermoelectric device due to different material expansion when exposed to large temperature variations.

As used herein, the term "bridging structure" relates to all layers and elements of the thermoelectric device that surrounds the at least one first and at least one second thermoelectric element. The bridging structure can electrically connect the thermoelectric elements and may be in contact with a heat source and a cooling device on opposite sides of the thermoelectric device.

As used herein, the term "bridging layer" relates to a layer of the bridging structure including a silver-gallium alloy and is surrounded by two silver layers. In one aspect, one of the silver layers surrounding the bridging layer can be an outer silver layer of the thermoelectric element, while the other silver layer may be a silver layer of the bridging structure. Furthermore, if not indicated otherwise, the term "bridging layer" addresses all the bridging layers of the bridging structure of the thermoelectric device.

Figure 1:
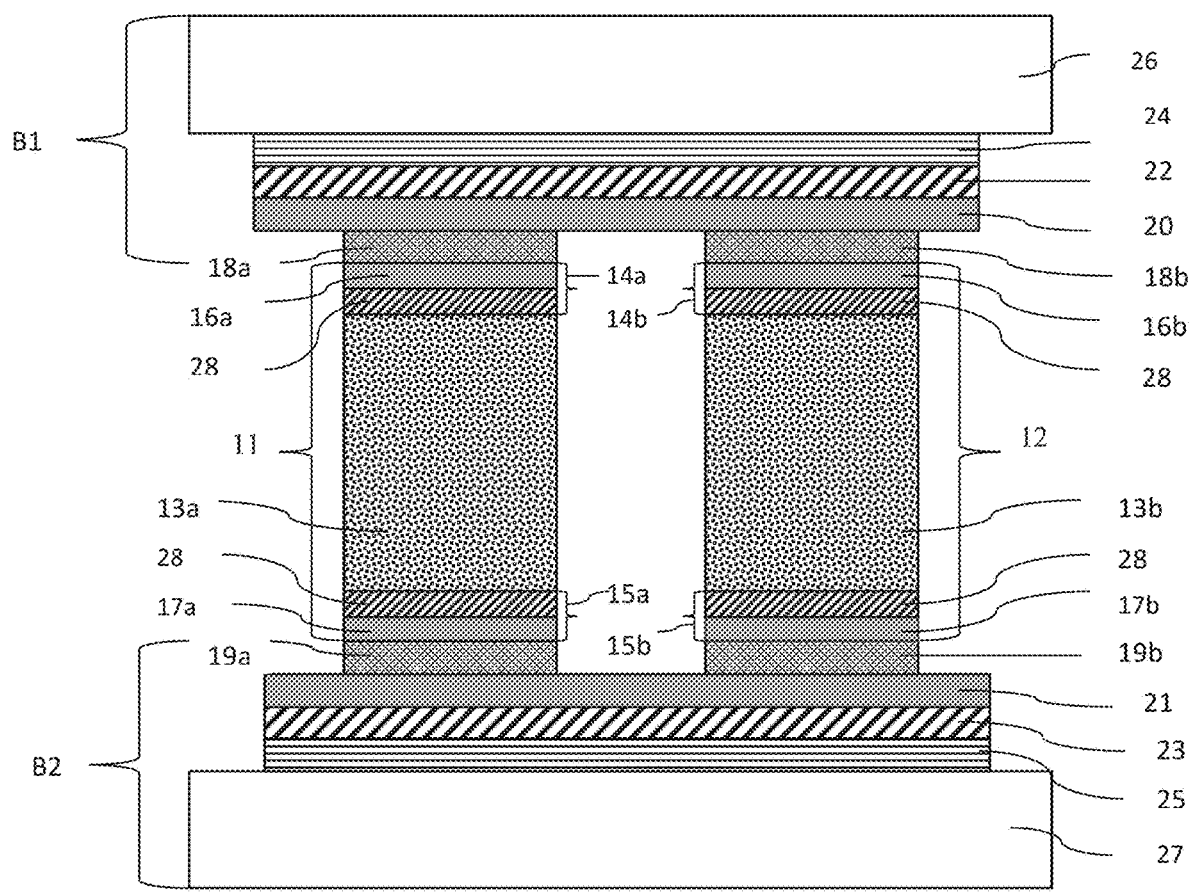
FIG. 1 includes an illustration of a thermoelectric device according to one embodiment.

An embodiment of a thermoelectric device of the present disclosure is illustrated in FIG. 1. The thermoelectric device (10) can include a first thermoelectric element (11) and a second thermoelectric element (12). Each of the first thermoelectric element (11) and the second thermoelectric element (12) can comprise a thermoelectric body (13a, 13b); a first multi-layer contact structure (14a, 14b) overlying a first outer surface of the thermoelectric body, and a second multi-layer contact structure (15a, 15b) overlying the second outer surface of the thermoelectric body on the opposite side of the thermoelectric body. The first multi-layer contact structure (14a) may comprise at least one metal layer (28) and as an outer layer a first silver layer (16a, 16b), and the second multi-layer contact structure (15a, 15b) can also comprise at least one metal layer (28) and as an outer layer a second silver layer (17a, 17b). In a certain aspect, the at least one metal layer (28) of the first and second multi-layer contact structures can include at least one nickel layer.

The bridging structure of the thermoelectric device shown in FIG. 1 can include a first bridging layer (18a, 18b) directly overlying the first silver layer (16a, 16b), and a second bridging layer (19a, 19b) directly overlying the second silver layer (17a, 17b), wherein the first and second bridging layer may include a silver-gallium alloy. If not indicated otherwise, the term "bridging layer" used herein addresses both the at least one first bridging layer (18a, 18b) and the at least one second bridging layer (19a, 19b).

The bridging structure can further include a third silver layer (20) directly overlying the first bridging layer (18a, 18b) and a fourth silver layer (21) directly overlying the second bridging layer (19a, 19b). Furthermore, the bridging structure can include a first interconnecting layer (24) overlying the third silver layer (20); a second interconnecting layer (25) overlying the fourth silver layer (21); a first ceramic layer (26) overlying the first interconnecting layer (24); and a second ceramic layer (27) overlying the second interconnecting layer (25).

In one aspect, the bridging structure of the thermoelectric device can further comprise at least one metal layer (22) between the third silver layer (20) and the first interconnecting layer (24), and at least one metal layer (23) between the fourth silver layer (21) and the second interconnecting layer (25). In a particular embodiment, the at least one metal layer (22), (23) between the silver layer (20), (21) and the interconnecting layer (24), (25) of the bridging structure can be at least one nickel layer.

As further illustrated in FIG. 1, the bridging structure can include a first part (B1) and a second part (B2). In one aspect, the first part (B1) of the bridging structure can include the layer sequence: first bridging layer (18), third silver layer (20), at least one first metal layer (22), first interconnecting layer (24), and first ceramic layer (26). Similarly, the second bridging structure (B2) can comprise the sequence: second bridging layer (19), fourth silver layer (21), at least one first metal layer (23), second interconnecting layer (25), and second ceramic layer (27).

In one aspect, the first part of the bridging structure (B1) and the second part of the bridging structure (B2) can be identical, having the same arrangement, type of materials, and thickness of layers. In another aspect, the first part and the second part of the bridging structure may be different. A non-limiting example of a different first and second part of the bridging structure can be different ceramic layers, wherein the ceramic layer of the first part may be adapted for being in contact with a heat source, while the ceramic layer of the second part may be adapted for being in contact with a cooling device.

As used herein, the expression a layer "is overlying" a certain other layer should be understood in relation to the center of the thermoelectric body of the thermoelectric device, wherein the overlying layer is always further away from the center of the thermoelectric body as the layer covered by the overlying layer. Accordingly, an overlying layer can be positioned at the top side or on the opposite bottom side of the thermoelectric device.

In one embodiment, the bridging layer can be formed by applying a layer of a reactive liquid consisting essentially of gallium and tin, herein also called "gallium-tin alloy", between two silver layers, of which one silver layer can be the outer layer of the contact structure of the thermoelectric element and the other silver layer may be a layer of the bridging structure. The formed pre-assembly can be heated under pressure, wherein the gallium-tin alloy of the reactive liquid forms with the silver of the surrounding silver layers a silver-gallium alloy.

As used herein, "reactive liquid consisting essentially of gallium and tin" means that the reactive liquid does not contain any other metals or transition metals in a total amount of greater than 0.1 wt % based on the total weight of the reactive liquid. In a certain particular aspect, the reactive liquid is free of any other metals or transition metals except for unavoidable impurities.

In one aspect, the amount of gallium in the reactive gallium-tin liquid can be at least 80 wt % based on the total weight of the reactive liquid, such as at least 85 wt %, at least 90 wt %, or at least 92 wt %, or at least 95 wt %. In another aspect, the amount of tin in the reactive liquid may be not greater than 20 wt % based on the total weight of the reactive liquid, such as not greater than 15 wt %, not greater than 10 wt %, not greater than 8 wt %, or not greater than 5 wt %. In a particular aspect, the reactive liquid can include 92 wt % gallium and 8 wt % tin based on the total weight of the reactive liquid.

In one embodiment, the thickness of the applied reactive gallium-tin liquid layer can be at least 1 micron, or at least 3 microns, or at least 5 microns, or at least 10 microns, or at least 15 microns, at least 20 microns, or at least 30 microns. In another embodiment, the thickness of the reactive liquid layer may be not greater than 80 microns, or not greater than 70 microns, or not greater than 50 microns, or not greater than 40 microns, or not greater than 30 microns, or not greater than 25 microns, or not greater than 20 microns. The thickness of the reactive liquid layer may be a number between any of the minimum and maximum numbers listed above.

The reactive gallium-tin liquid layer can be applied on the above-described silver layers by different methods, for example, by coating with a brush, dip-coating, or spraying. In a particular aspect, the reactive liquid layer can be applied by using a brush.

The forming of the silver-gallium alloy may start already at room temperature as soon as the gallium-tin liquid gets in contact with the silver layers. In order to fully cure the applied gallium-tin liquid by forming a silver-gallium alloy, the formed pre-assembly can be heated to an elevated temperature, herein also called maximum temperature. In one aspect, the maximum temperature can be at least 150° C., or at least 180° C., or at least 200° C., or at least 250° C., or at least 300° C. In a further aspect, the maximum temperature may be not greater than the melting temperature of the material of the thermoelectric body. In a certain aspect, the maximum temperature for curing may be at least 20° C. below the melting temperature of the material of the thermoelectric body. As used herein, the term "curing" of the gallium-tin layer relates to the reaction of the gallium-tin alloy with silver to a silver-gallium alloy.

The time for subjecting the reactive liquid to the maximum temperature may depend on the selected maximum temperature. Generally, a high maximum temperature may require a shorter curing time than a lower maximum temperature. In one aspect, heating can be conducted at the maximum temperature for a time of at least 10 minutes, or at least 20 minutes, or at least 30 minutes, or at least 60 minutes, or at least 100 minutes, or at least 120 minutes. In a particular embodiment, a maximum temperature of 300° C. may require a time of about 30 minutes for curing, while a maximum temperature of 150° C. can require a curing time of about 120 minutes.

In another embodiment, after applying the reactive gallium-tin layer between the silver layers of the thermoelectric element and the bridging structure, a pressure can be applied on the formed pre-assembly to enhance the reaction of the reactive liquid with the silver of the silver layers. In one aspect, the pressure can be applied by placing the pre-assembly between two parallel positioned compression plates and compressing the assembly in z-direction between the compression plates. The applied compression pressure can be at least 1 psi, such as at least 5 psi, at least 10 psi, at least 20 psi, at least 30 psi, or at least 50 psi. In another aspect, the pressure may be not greater than 100 psi, or not greater than 80 psi, or not greater than 60 psi. In a particular aspect, the pressure can be between 3 psi and 10 psi.

In a certain aspect, the compression can be maintained after the heat treatment and removing of the compression plates by forming a ceramic encapsulation around the perimeter of the device while being under compression to provide additional strength and stability to the thermoelectric device.

As used herein, the bridging layer formed by the reaction of the applied liquid gallium-tin alloy with the silver of the silver layers is called herein "silver-gallium alloy" layer or "AgGa-alloy layer." The AgGa-alloy layer can also include, to a certain amount, tin from the gallium-tin alloy. The presence of the tin is not specifically mentioned in the selected name of the silver-gallium layer, since tin is only contained in a minor amount, while the majority is silver and gallium. It is furthermore appreciated that the term "AgGa" (if not described otherwise) is not expressing the molar ratio of Ag to Ga in the alloy, and is used merely to address the presence of Ag and Ga.

In a certain particular aspect, the silver-gallium alloy of the bridging layer can include $Ag_2Ga$. In a particular certain aspect, a majority of the silver-gallium alloy layer can include $Ag_2Ga$.

In one embodiment, the bridging layer (silver-gallium alloy layer) can have a thickness of at least 1 micron, or at least 2 microns, or at least 5 microns, or at least 10 microns, or at least 15 microns, or at least 20 microns, or at least 25 microns, or at least 30 microns. In another aspect, the thickness of each of the bridging layers may be not greater than 80 microns, or not greater than 75 microns, or not greater than 60 microns, or not greater than 50 microns, or not greater than 40 microns, or not greater than 35 microns. The thickness of the bridging layer can be a value between any of the minimum and maximum numbers listed above.

An indication that curing has been completed and a suitable bridging layer has been formed can be obtained by measuring the stability of the electrical performance of the device as it is subjected to temperature cycling. The stability is represented by the percent difference between the expected performance and the actual performance as the device is repeatedly cycled through a given test temperature regime (measured as the change in the short circuit current $I_{SC}$ at the peak temperature during a temperature cycle), see also the description in the example section. The lower the decrease of the measured $I_{SC}$ during temperature cycling, the better the stability.

Figure 2:
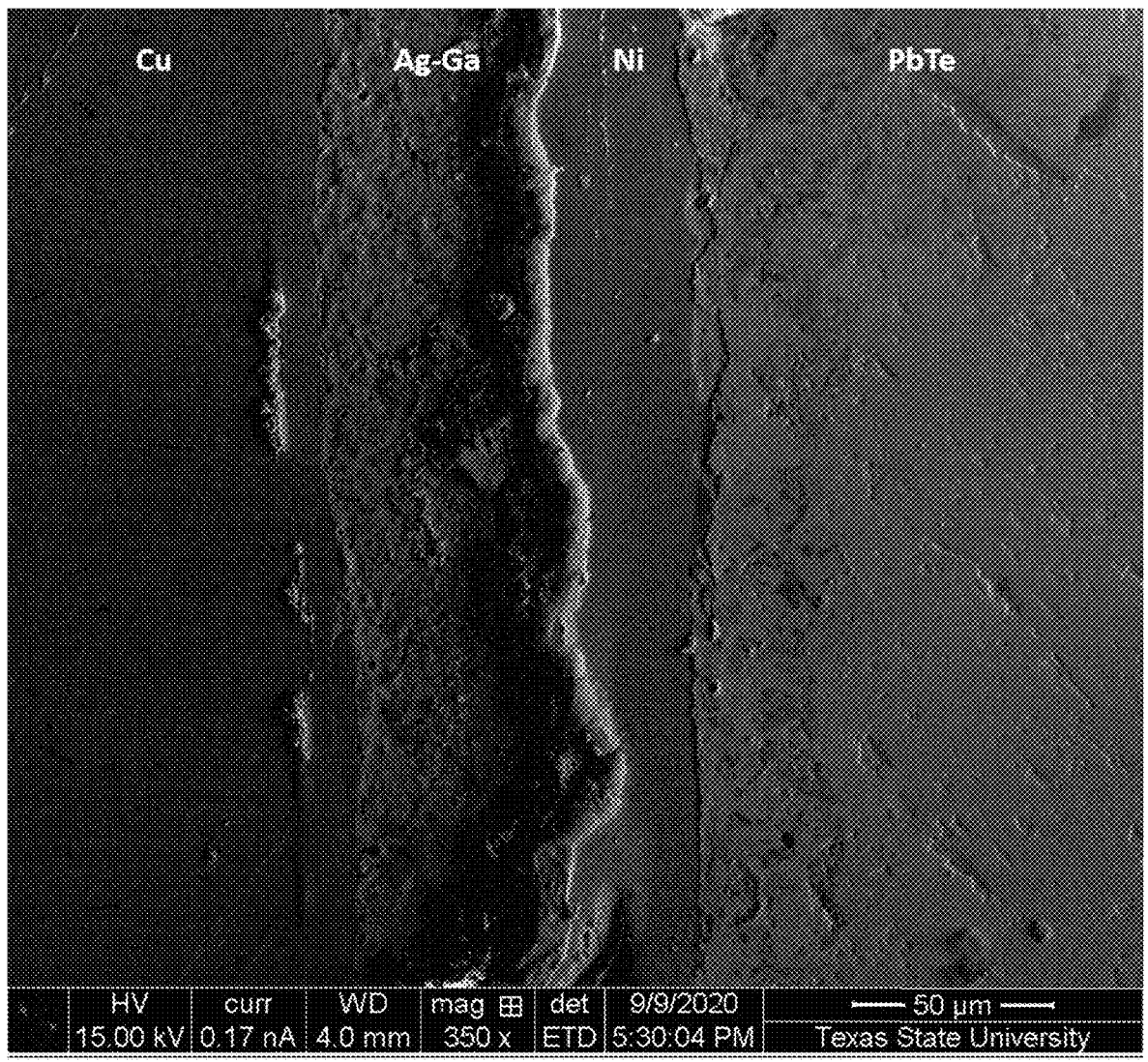
FIG. 2 includes an optical image of a crosscut through a silver-gallium alloy layer (bridging layer) according to one embodiment.

An optical image of a cross-cut through a cured AgGa-alloy layer can be seen in FIG. 2.

The ceramic layer of the thermoelectric device of the present disclosure can be in non-limiting examples alumina, aluminum nitride, or boron nitride. In one aspect, the ceramic layer can have a thickness of at least 1 mm, or at least 1.5 mm, or at least 2 mm, or at least 3 mm. In another aspect, the ceramic layer may be not greater than 5 mm, or not greater than 4 mm, or not greater than 3 mm.

The interconnecting layer, as used herein, is a layer that electrically connects two adjacent positioned thermoelectric elements, also called herein a thermoelectric couple. A preferred material of the interconnecting layer can be copper; however, the interconnecting layer may not be limited to copper and can be any other metal or metal alloy suitable to electrically connect two thermoelectric elements of the device. In one aspect, the thickness of the interconnecting layer can be at least 200 microns, or at least 300 microns, or at least 400 microns. In another aspect, the interconnecting layer may be not greater than 800 microns, of not greater than 700 microns, or not greater than 500 microns.

In one aspect, the interconnecting layer can be attached to the ceramic layer by an adhesive, but may not be limited to this method.

In another aspect, the at least one metal layer between the interconnecting layer and the silver layer can be at least one nickel layer. In a particular aspect, the thickness of the at least one nickel layer next to the interconnecting layer may be between 40 microns and 100 microns.

The thermoelectric body of the at least one first thermoelectric element and the at least one second thermoelectric element can comprise any thermoelectric material suitable for converting thermal energy to electrical energy. In one aspect, the first thermoelectric element can comprise a thermoelectric body including a p-type semiconductor, and the second thermoelectric element may comprise a thermoelectric body including an n-type semiconductor material. In one particular aspect, the p-type semiconductor material can comprise a p-type TAGS material. In yet another particular aspect, the n-type semiconductor material may be an n-type PbTe material.

As described above and illustrated in FIG. 1, the outer layer of the first multi-layer contact structure (14a,b) and the second multi-layer contact structure (15a,b) of the thermoelectric bodies may be a silver layer, herein also called first silver layer (16a,b) and second silver layer (17a,b). In one aspect, the thickness of each of the first and second silver layers can be at least 10 microns, or at least 15 microns, or at least 20 microns, or at least 25 microns. In another aspect, the thickness of each silver layer may be not greater than 50 microns, or not greater than 40 microns, or not greater than 30 microns.

In one embodiment, the thickness of the silver layers of the bridging structure herein called third and fourth silver layers can have the same thickness as the first and second silver layers of the thermoelectric element.

In another embodiment, each of the first multi-layer contact structure (14a,b) and the second multi-layer contact structure (15a,b) of the thermoelectric elements can comprise at least one metal layer (28) between each of the first and second silver layer and being in direct contact with the thermoelectric body. In a particular aspect, the at least one metal layer (28) may include two nickel layers. In another particular aspect, the at least one metal layer (28) can include four nickel layers. In yet a further aspect, the at least one contact metal layer (28) can include a nickel mesh at least partially embedded within an outer region of the thermoelectric element, and being in direct contact with at least one overlying nickel layer.

In another aspect (not shown in FIG. 1) a barrier layer can be further contained between the thermoelectric body (13a, b) and the at least one metal layer (28) of the first and second contact structure. The presence of a barrier layer depends on the type of thermoelectric material and can prevent diffusion of the material of the thermoelectric body into the contact structure.

The thermoelectric device of the present disclosure can be adapted that the first ceramic layer of the first part of the bridging structure can be in contact with a heat source, and the second ceramic layer of the second part of the bridging structure may be in contact with a cooling device to create a temperature gradient throughout the thickness of the thermoelectric device. In one aspect, the heat source being in contact with the first ceramic layer can have a temperature of at least 100° C., or at least 300° C., or at least 400° C. In another aspect, the heat source may not have a temperature greater than 600° C. or greater than 500° C.

It has been surprisingly observed that the presence of a bridging layer including a silver-gallium alloy can provide a certain desired flexibility and elasticity to compensate stress tensions caused by different material expansions during exposure of the thermoelectric device to high temperature variations. The silver-gallium alloy containing layer can further have a very low electrical and thermal resistance such that its presence within the multi-layer contact structure of the thermoelectric device may have nearly no detrimental effect on the efficiency of the device.

In a particular embodiment, the thermoelectric device of the present disclosure can have a plurality of first thermoelectric elements in alternating arrangement with a plurality of second thermoelectric elements. In one aspect, an amount of each of the first thermoelectric elements and the second thermoelectric elements can be at least 15, such as at least 20, at least 30, at least 40, or at least 50.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

EMBODIMENTS

Embodiment 1. A thermoelectric device comprising at least one first thermoelectric element, at least one second thermoelectric element and a bridging structure, wherein each of the first and second thermoelectric element comprises a thermoelectric body; a first multi-layer metal contact structure overlying a first outer surface of the thermoelectric body; and a second multi-layer metal contact structure overlying a second outer surface of the thermoelectric body, the first outer surface of the thermoelectric body being opposite to the second outer surface, wherein the first multi-layer contact structure comprises as an outer layer a first silver layer, and the second multi-layer contact structure comprises as an outer layer a second silver layer; the bridging structure comprising a first bridging layer comprising a silver-gallium alloy and a second bridging layer comprising a silver-gallium alloy, wherein the first bridging layer is directly overlying the first silver layer of the first contact structure, and the second bridging layer is directly overlying the second silver layer of the second contact structure; and the bridging structure electrically connects the at least one first thermoelectric element and the at least one second thermoelectric element.

Embodiment 2. The thermoelectric device of embodiment 1, wherein the bridging structure further comprises: a third silver layer directly overlying the first bridging layer of each of the first and the second thermoelectric element; a fourth silver layer directly overlying the second bridging layer of each the first and the second thermoelectric element; a first interconnecting layer overlying the third silver layer; a second interconnecting layer overlying the fourth silver layer; a first ceramic layer overlying the first interconnecting layer; and a second ceramic layer overlying the second interconnecting layer.

Embodiment 3. The thermoelectric device of embodiment 2, wherein the bridging structure further comprises at least one nickel layer between the third silver layer and the first interconnecting layer, and at least one nickel layer between the fourth silver layer and the second interconnecting layer.

Embodiment 4. The thermoelectric device of any one of embodiments 1-3, wherein a thickness of each of the first bridging layer and the second bridging layer is at least 5 microns, such as at least 10 microns, at least 20 microns, at least 25 microns, or at least 30 microns.

Embodiment 5. The thermoelectric device of any one of embodiments 1-3, wherein a thickness of each of the first bridging layer and the second bridging layer is not greater than 80 microns, or not greater than 75 microns, or not greater than 60 microns, or not greater than 50 microns, or not greater than 40 microns.

Embodiment 6. The thermoelectric device of any one of embodiments 1-5, wherein a thickness of the first bridging layer and a thickness of the second bridging layer is the same.

Embodiment 7. The thermoelectric device of any one of embodiments 1-6, wherein a material of the first bridging layer and of the second bridging layer includes $Ag_2Ga$.

Embodiment 8. The thermoelectric device of any one of embodiments 2-7, wherein a material of the first interconnecting layer and of the second interconnecting layer includes copper.

Embodiment 9. The thermoelectric device of any one of embodiments 2-8, wherein a thickness of each of the first interconnecting layer and the second interconnecting layer is at least 200 microns, or at least 300 microns, or at least 400 microns.

Embodiment 10. The thermoelectric device of any one of embodiments 2-9, wherein a thickness of each of the first and second interlayer is not greater than 800 microns, or not greater than 700 microns, or not greater than 500 microns.

Embodiment 11. The thermoelectric device of any one of embodiments 1-10, wherein the at least one first thermoelectric element comprises a different thermoelectric body than the at least one second thermoelectric element.

Embodiment 12. The thermoelectric device of any one of embodiments 1-11, wherein the first thermoelectric element comprises a thermoelectric body including a p-type semiconductor and the second thermoelectric element comprises a thermoelectric body including an n-type semiconductor material.

Embodiment 13. The thermoelectric device of any one of embodiments 1-12, wherein the first thermoelectric element comprises a thermoelectric body including a p-type TAGS semiconductor material.

Embodiment 14. The thermoelectric device of any one of embodiments 1-12, wherein the second thermoelectric element comprises a thermoelectric body including an n-type PbTe semiconductor material.

Embodiment 15. The thermoelectric device of any of embodiments 1-14, wherein each of the first multi-layer contact structure and the second multi-layer contact structure comprises at least two nickel layers underneath each of the first and second silver layers and in direct contact with the thermoelectric body.

Embodiment 16. The thermoelectric device of embodiment 15, wherein each of the first multi-layer contact structure and the second multi-layer contact structure comprises four nickel layers underneath each of the first and second silver layers and in direct contact with the thermoelectric body.

Embodiment 17. The thermoelectric device of any one of embodiments 1-16, wherein a thickness of each of the first silver layer and the second silver layer is at least 2 microns, or at least 5 microns, or at least 10 microns, or at least 15 microns, or at least 20 microns, or at least 25 microns.

Embodiment 18. The thermoelectric device of any one of embodiments 1-16, wherein a thickness of each of the first silver layer and the second silver layer is not greater than 50 microns, or not greater than 40 microns, or not greater than 30 microns.

Embodiment 19. The thermoelectric device of any one of embodiments 1-18, wherein a thickness of each of the third and fourth silver layer is at least 2 microns, or at least 5 microns, or at least 10 microns, or at least 15 microns, or at least 20 microns, or at least 25 microns.

Embodiment 20. The thermoelectric device of any one of embodiments 1-18, wherein a thickness of each of the third and fourth silver layer is not greater than 50 microns, or not greater than 40 microns, or not greater than 30 microns.

Embodiment 21. The thermoelectric device of any one of embodiments 1-20, wherein a material of the first ceramic layer and/or of the second ceramic layer includes alumina, aluminum nitride or boron nitride.

Embodiment 22. The thermoelectric device of embodiment 21, wherein the first ceramic layer comprises the same material as the second ceramic layer.

Embodiment 23. The thermoelectric device of any one of embodiments 1-22, wherein the device is adapted that the first ceramic layer can be in contact with a heat source having a temperature of at least 100° C., such as at least 200° C., at least 300° C., or at least 350° C.

Embodiment 24. The thermoelectric device of any one of embodiments 1-22, wherein the device is adapted that the first ceramic layer can be in contact with a heat source having a temperature not greater than 600° C., or not greater than 550° C., or not greater than 400° C.

Embodiment 25. The thermoelectric device of any of embodiments 1-24, wherein an amount of each of the first thermoelectric element and the second thermoelectric element is at least 15, or at least 20, or at least 30, at least 40, or at least 50.

Embodiment 26. A method of forming a thermoelectric device, comprising: providing a first thermoelectric element and a second thermoelectric element, wherein each of the first thermoelectric element and the second thermoelectric element comprises a thermoelectric body surrounded by a first multi-layer contact structure and a second multi-layer contact structure, wherein the first multi-layer contact structure comprises as an outer layer a first silver layer and the second multi-layer contact structure comprises as an outer layer a second silver layer; applying a reactive liquid as a first reactive liquid layer to the first silver layer and a second reactive liquid layer to the second silver layer of each of the first thermoelectric element and the second thermoelectric element, wherein the reactive liquid consists essentially of gallium and tin; attaching the first thermoelectric element and the second thermoelectric element to a bridging structure to form a pre-assembly, wherein the bridging structure comprises a first part and a second part, the first part including a third silver layer and the second part including a fourth silver layer, the third silver layer being in direct contact with the first reactive liquid layer overlying the first silver layer, and the fourth silver layer being in direct contact with the second reactive liquid layer overlying the second silver layer; and at least partially curing the first reactive liquid layer and the second reactive liquid layer of the pre-assembly to form a first bridging layer and a second bridging layer, the first bridging layer and the second bridging layer each including a silver-gallium alloy.

Embodiment 27. The method of embodiment 26, wherein an amount of gallium in the reactive liquid is at least 80 wt % based on the total weight of the reactive liquid, such as at least 85 wt %, at least 90 wt %, or at least 95 wt %.

Embodiment 28. The method of embodiments 25 or 27, wherein an amount of tin in the reactive liquid is not greater than 20 wt % based on the total weight of the reactive liquid, such as not greater than 15 wt %, not greater than 10 wt %, or not greater than 5 wt %.

Embodiment 29. The method of any one of embodiments 26-28, wherein the reactive liquid includes 92 wt % gallium and 8 wt % tin based on the total weight of the reactive liquid.

Embodiment 30. The method of any one of embodiments 26-29, wherein a thickness of the applied first reactive liquid layer and the second reactive liquid layer is at least 1 micron, or at least 3 microns, or at least 5 microns, or at least 10 microns, or at least 15 microns, or at least 20 microns, or at least 30 microns, or at least 40 microns.

Embodiment 31. The method of any one of embodiments 26-29, wherein a thickness of the applied first reactive liquid layer and the second reactive liquid layer is not greater than 80 microns, or not greater than 70 microns, or not greater than 60 microns, or not greater than 50 microns, or not greater than 40 microns, or not greater than 30 microns, or not greater than 25 microns, or not greater than 20 microns.

Embodiment 32. The method of any one of embodiments 26-31, wherein applying the first reactive liquid layer and the second reactive liquid layer is conducted by using a brush.

Embodiment 33. The method of any one of embodiments 26-32, wherein applying the first reactive liquid layer and the second reactive liquid layer is conducted at room temperature.

Embodiment 34. The method of any one of embodiments 26-33, wherein curing includes heating the pre-assembly to a maximum temperature of at least 150° C., or at least 200° C., or at least 250° C., or at least 300° C.

Embodiment 35. The method of embodiment 26-33, wherein heating is conducted at the maximum temperature for a time of at least 10 minutes, or at least 20 minutes, or at least 30 minutes, or at least 60 minutes, or at least 100 minutes, or at least 120 minutes.

Embodiment 36. The method of any one of embodiments 26-35, further comprising applying pressure on the pre-assembly in a height (z)-direction.

Embodiment 37. The method of embodiment 36, wherein the pressure is applied by placing the pre-assembly between two compression plates.

Embodiment 38. The method of embodiment 36 or 37, wherein the applied pressure is at least 1 psi, or at least 3 psi, or at least 10 psi, or at least 40 psi.

Embodiment 39. The method of embodiment 36, wherein the applied pressure is not greater than 100 psi, or not greater than 80 psi, or not greater than 60 psi, or not greater than 50 psi, or not greater than 30 psi, or not greater than 10 psi.

Embodiment 40. The method of any one of embodiments 26-39, wherein the first part of the bridging structure further comprises a first interconnecting layer and a first ceramic layer, the first interconnecting layer being positioned between the third layer including silver and the first ceramic layer; and wherein the second part of the bridging structure further comprises a second interconnecting layer and a second ceramic layer, the second interconnecting layer being positioned between the fourth layer including silver and the second ceramic layer.

Embodiment 41. The method of any one of embodiments 26-40, wherein a thickness of each of the first bridging layer and the second bridging layer is at least 1 micron, such as at least 5 microns, at least 10 microns, at least 20 microns, at least 25 microns, or at least 30 microns.

Embodiment 42. The method of any one of embodiments 26-41, wherein a thickness of each of the first bridging layer and the second bridging layer is not greater than 80 microns, or not greater than 75 microns, or not greater than 60 microns, or not greater than 50 microns, or not greater than 40 microns, or not greater than 35 microns, or not greater than 20 microns.

EXAMPLES

The following non-limiting examples illustrate the present invention.

Example 1

Preparation of a Thermoelectric Device Including a Plurality of Thermoelectric Elements.

Figure 3A:
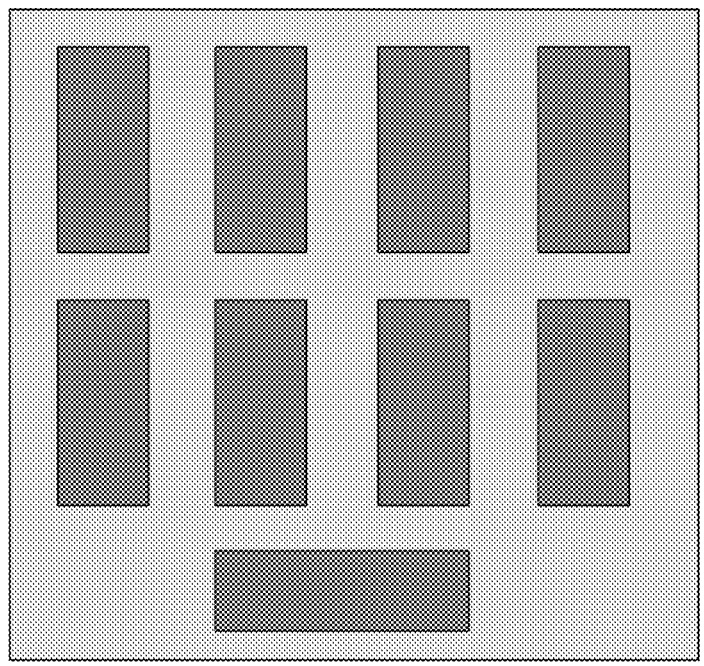
FIG. 3A includes an illustration of a top view on a lower plate of the thermoelectric device during manufacturing.

A pre-manufactured lower device plate was placed in an assembly jig. The lower device plate included a ceramic plate with nine attached interconnecting plates. Each interconnecting plate contained the following layer structure: a copper layer (interconnecting layer), one nickel layer, and one plated silver layer. The copper layer had a thickness of about 200 microns, the nickel layer a thickness of about 50 microns, and the silver layer a thickness of about 10 microns. The interconnecting plates were attached by the copper layer to the ceramic plate via an adhesive. A top view of the lower device plate can be seen in FIG. 3A.

Figure 3B:
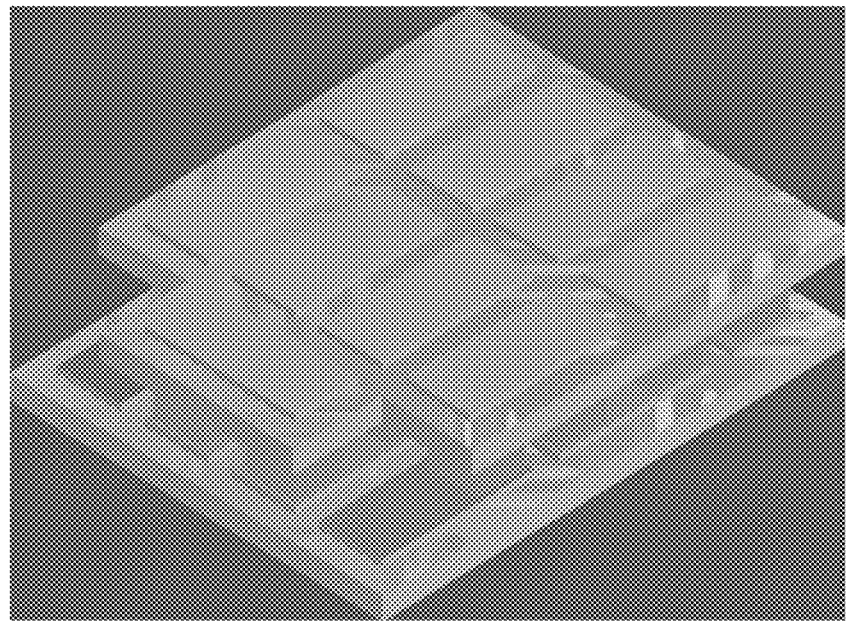
FIG. 3B includes an illustration of a perspective view of a thermoelectric device according to one embodiment.

After placing the lower device plate in the assembly kit, the outer silver layers of the interconnecting plates were coated at room temperature with a liquid gallium-tin alloy using a brush. The gallium-tin alloy contained 92 wt % gallium and 8 wt % tin, and the applied layer of the gallium-tin alloy had a thickness of about 50 microns. Thereafter, p-type and n-type thermoelectric elements were placed in alternating order on the gallium-tin coated interconnecting plates. The p-type thermoelectric element contained a p-type TAGS material as thermoelectric body, and the n-type thermoelectric element contained a PbTe material as thermoelectric body. The thermoelectric bodies had a diameter of about 20 mm and a thickness of about 2 mm. All thermoelectric elements contained on both sides of the thermoelectric body a multi-layer contact structure including an about 40 microns thick nickel mesh embedded within the outer region of the thermoelectric body, a first nickel layer (about 50 nm thick) being in direct contact with the nickel mesh, a second nickel layer (about 10 microns thick) directly plated on the first nickel layer, and a silver layer (about 15 microns thick) directly plated on the second nickel layer. When placing the thermoelectric elements on the interconnecting plates, the outer silver layer of the multi-layer contact structure of the thermoelectric elements was directly attached to the gallium-tin alloy layer. After placing the thermoelectric elements on the lower device plate, an upper device plate having the same structure as the lower device plate (i.e., ceramic layer, one copper layer, one nickel layer, and one silver layer) was coated on the silver layer with reactive gallium-tin alloy and thereafter placed with the gallium-tin coated side on the outer silver layers of the thermoelectric elements that were placed on the lower module plate. A perspective view of the formed assembly is illustrated in FIG. 3B, and a side-view is shown in FIG. 3C.

Figure 3C:
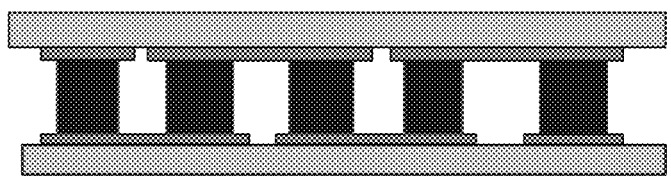
FIG. 3C includes an illustration of a side view of the thermoelectric device of FIG. 3B.

After forming the pre-assembly shown in FIG. 3C, the pre-assembly was placed between two compression plates, and a compression pressure of about 2 psi was applied on the pre-assembly in the height direction (z). Thereafter, the compressed pre-assembly was subjected to a heat treatment regime in an oven. The heat treatment regime included heating the oven to a maximum temperature of 300° C., holding the temperature for 30 minutes at the maximum temperature, followed by free cooling. After the heat treatment under compression, the thickness of the formed silver-gallium layer (bridging layer) was about 75 microns.

Following the heat treatment, the compression plates were removed from the formed device. Thereafter, the device was recompressed and sealed around its perimeter with ceramic potting material Durapot 809, a magnesia-based ceramic cement. The ceramic potting material was cured to form a ceramic that could keep the device under compression.

Example 2

Comparative Thermoelectric Devices with Different Materials in Bridging Layer.

A comparative thermoelectric device (C1) was made the same way as the thermoelectric device described in Example 1, except that the bridging layer was a silver-indium alloy instead of a silver-gallium alloy. The silver-indium alloy (confirmed with SEM energy dispersive spectroscopy) was formed by electroplating a pure indium metal on the silver layers and conducting the same annealing under compression. The indium formed together with the silver of the silver layers a silver-indium alloy, the thickness of the silver-indium bridging layer was about 50 microns.

Further comparative thermoelectric devices were made using the following materials for forming the bridging layer with a thickness of about 50 microns: a gallium-indium eutectic (containing 75.5 wt % Ga and 24.5 wt % In) to form a silver-indium-gallium alloy (comparative sample C2); and a gallium-indium-tin eutectic (containing 66 wt % Ga, 20.5 wt % In, and 13.5 wt % Sn) to form a silver-indium-gallium-tin alloy (comparative sample C3).

An evaluation of the lifetime of the comparative thermoelectric devices compared to the thermoelectric device of Example 1 is summarized in Example 4.

Example 3

Comparison of Different Curing Stages of the Bridging Layer.

Thermoelectric devices as described in Example 1 were made by varying the annealing time and temperature to show the influence of the annealing conditions on the forming of the silver-gallium alloy and the final performance of the device.

Figure 4:
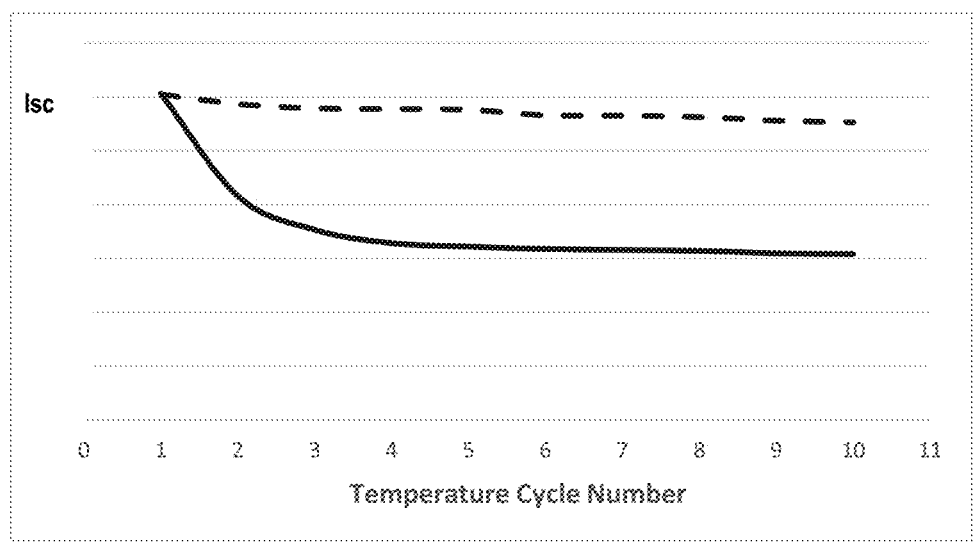
FIG. 4 includes a graph illustrating a stabilization curve of a thermoelectric device according to one embodiment.

FIG. 4 shows two representative stabilization curves for two different thermoelectric devices. As used herein, a stabilization curve expresses the performance of the device corresponding to the measured short circuit current $I_{SC}$ at the maximum peak temperature during temperature cycling. The change in the $I_{SC}$ can be considered being proportional to the change of the resistance of the AgGa layer. If the AgGa layer (bridging layer) is sufficiently cured, that means the reactive GaSn liquid is fully converted by reacting with the silver layers to AgGa, the loss in resistance, i.e., the decrease in the $I_{SC}$, is low (see FIG. 4, dashed line). In comparison, when the AgGa layer is incompletely formed, a quick early-life shift in the performance output can be observed, as shown by the solid line in FIG. 4. The number of cycles shown at the x-axis relate not to actual numbers of cycles, which can be between 80 to 300 or more, but shall only indicate the increase in the number of cycles.

Example 4

Testing of the Lifetime/Performance of the Thermoelectric Device.

The thermoelectric device of Example 1 and the comparative devices C1, C2, and C3 of Example 2 were subjected to high temperature cycles between 80° C. and 300° C. on the hot side of the device, and the maximum short circuit current $I_{SC}$ at the peak temperature was measured during each cycle. The lifetime of a thermoelectric device was defined as the number of cycles counted when the measured maximum short circuit current $I_{SC}$ decreased more than 15% as compared to the maximum short circuit current $I_{SC}$ measured during the first cycle.

The thermoelectric device of Example 1 had an about two times higher lifetime than comparative thermoelectric device C3, and an about four times higher lifetime than comparative device C1. Within the comparative examples, best results were observed with C3, followed by C2 and C1, but all devices of the comparative examples were clearly inferior to the device of Example 1.

What is claimed is:

1. A thermoelectric device comprising at least one first thermoelectric element, at least one second thermoelectric element and a bridging structure, wherein
    each of the first and second thermoelectric elements comprises a thermoelectric body; a first multi-layer metal contact structure overlying a first outer surface of the thermoelectric body; and a second multi-layer metal contact structure overlying a second outer surface of the thermoelectric body, the first outer surface of the thermoelectric body being opposite to the second outer surface, wherein the first multi-layer contact structure comprises as an outer layer a first silver layer, and the second multi-layer contact structure comprises as an outer layer a second silver layer;
    the bridging structure comprising a first bridging layer comprising a silver-gallium alloy and a second bridging layer comprising a silver-gallium alloy, wherein the first bridging layer is directly overlying the first silver layer of the first contact structure, and the second bridging layer is directly overlying the second silver layer of the second contact structure; and
    the bridging structure electrically connects the at least one first thermoelectric element and the at least one second thermoelectric element,
    wherein a material of the first bridging layer and of the second bridging layer includes $Ag_2Ga$.

2. The thermoelectric device of claim 1, wherein a thickness of each of the first bridging layer and the second bridging layer is at least 5 microns.

3. The thermoelectric device of claim 1, wherein the device is adapted that the first ceramic layer can be in contact with a heat source having a temperature of at least 100° C. and not greater than 600° C.

4. The thermoelectric device of claim 1, wherein an amount of each of the first thermoelectric element and the second thermoelectric element is at least 15.

5. The thermoelectric device of claim 1, wherein the bridging structure further comprises:
    a third silver layer directly overlying the first bridging layer of each of the first and the second thermoelectric element;
    a fourth silver layer directly overlying the second bridging layer of each the first and the second thermoelectric element;
    a first interconnecting layer overlying the third silver layer;
    a second interconnecting layer overlying the fourth silver layer;
    a first ceramic layer overlying the first interconnecting layer; and
    a second ceramic layer overlying the second interconnecting layer.

6. The thermoelectric device of claim 5, wherein the bridging structure further comprises at least one nickel layer between the third silver layer and the first interconnecting layer, and at least one nickel layer between the fourth silver layer and the second interconnecting layer.

7. The thermoelectric device of claim 5, wherein a material of the first interconnecting layer and of the second interconnecting layer includes copper.

8. The thermoelectric device of claim 5, wherein a thickness of each of the first interconnecting layer and the second interconnecting layer is at least 200 microns.

9. The thermoelectric device of claim 1, wherein the at least one first thermoelectric element comprises a different thermoelectric body than the at least one second thermoelectric element.

10. The thermoelectric device of claim 9, wherein the first thermoelectric element comprises a thermoelectric body including a p-type semiconductor and the second thermoelectric element comprises a thermoelectric body including an n-type semiconductor material.

11. The thermoelectric device of claim 9, wherein the first thermoelectric element comprises a thermoelectric body including a p-type TAGS semiconductor material.

12. The thermoelectric device of claim 9, wherein the second thermoelectric element comprises a thermoelectric body including an n-type PbTe semiconductor material.

13. A method of forming a thermoelectric device, comprising:
    providing a first thermoelectric element and a second thermoelectric element, wherein each of the first thermoelectric element and the second thermoelectric element comprises a thermoelectric body surrounded by a first multi-layer contact structure and a second multi-layer contact structure, wherein the first multi-layer contact structure comprises as an outer layer a first silver layer and the second multi-layer contact structure comprises as an outer layer a second silver layer;
    applying a reactive liquid as a first reactive liquid layer to the first silver layer and a second reactive liquid layer to the second silver layer of each of the first thermoelectric element and the second thermoelectric element, wherein the reactive liquid consists essentially of gallium and tin;
    attaching the first thermoelectric element and the second thermoelectric element to a bridging structure to form a pre-assembly, wherein the bridging structure comprises a first part and a second part, the first part including a third silver layer and the second part including a fourth silver layer, the third silver layer being in direct contact with the first reactive liquid layer overlying the first silver layer, and the fourth silver layer being in direct contact with the second reactive liquid layer overlying the second silver layer; and
    at least partially curing the first reactive liquid layer and the second reactive liquid layer of the pre-assembly to form a first bridging layer and a second bridging layer, the first bridging layer and the second bridging layer each including a silver-gallium alloy.

14. The method of claim 13, wherein an amount of gallium in the reactive liquid is at least 80 wt %.

15. The method of claim 13, wherein the first bridging structure and the second bridging structure include $Ag_2Ga$.

16. The method of any one of claim 13, further comprising applying pressure on the pre-assembly in a height (z)-direction.

17. The method of claim 13, wherein the applied pressure is at least 1 psi and not greater than 80 psi.

18. The method of claim 13, wherein curing includes heating the pre-assembly to a maximum temperature of at least 150° C.

19. The method of claim 18, wherein heating is conducted at the maximum temperature for a time of at least 10 minutes.

\* \* \* \* \*